US012647128B2

(12) United States Patent
Cho

(10) Patent No.: US 12,647,128 B2
(45) Date of Patent: Jun. 2, 2026

(54) SIGMA DELTA MODULATION DEVICE CAPABLE OF SWITCHING ORDER OF LOOP FILTER, AND LOOP FILTER FOR SIGMA DELTA MODULATION DEVICE

(71) Applicant: THE INDUSTRY & ACADEMIC COOPERATION IN CHUNGNAM NATIONAL UNIVERSITY (IAC), Daejeon (KR)

(72) Inventor: Young-Kyun Cho, Daejeon (KR)

(73) Assignee: THE INDUSTRY & ACADEMIC COOPERATION IN CHUNGNAM NATIONAL UNIVERSITY (IAC), Daejeon (KR)

( * ) Notice: Subject to any disclaimer, the term of this patent is extended or adjusted under 35 U.S.C. 154(b) by 207 days.

(21) Appl. No.: 18/588,449

(22) Filed: Feb. 27, 2024

(65) Prior Publication Data

US 2025/0158635 A1      May 15, 2025

(30) Foreign Application Priority Data

Nov. 15, 2023      (KR) ........................ 10-2023-0158614

(51) Int. Cl.
*H03M 3/00* (2006.01)

(52) U.S. Cl.
CPC ........... *H03M 3/394* (2013.01); *H03M 3/324* (2013.01); *H03M 3/422* (2013.01)

(58) Field of Classification Search
CPC ...... H03M 3/394; H03M 3/324; H03M 3/422; H03M 3/458
USPC ........................................................ 341/125
See application file for complete search history.

(56) References Cited

U.S. PATENT DOCUMENTS

| | | | | |
|---|---|---|---|---|
| 9,356,618 | B2 * | 5/2016 | Cho .................... | H03H 11/1291 |
| 9,479,188 | B1 * | 10/2016 | Mason ................ | H03M 1/1225 |
| 10,063,252 | B2 * | 8/2018 | Cho ...................... | H03M 3/394 |
| 2016/0134301 | A1 * | 5/2016 | Li ...................... | H03H 11/0422 |
| | | | | 341/120 |
| 2017/0207796 | A1 * | 7/2017 | Cho ........................ | H03M 3/43 |
| 2018/0212619 | A1 * | 7/2018 | Cho ...................... | H03M 3/394 |
| 2023/0299787 | A1 * | 9/2023 | Chang .................... | H03M 3/47 |
| | | | | 341/143 |

FOREIGN PATENT DOCUMENTS

| | | |
|---|---|---|
| KR | 10-2011-0011532 A | 2/2011 |
| KR | 10-2018-0085996 A | 7/2018 |

* cited by examiner

*Primary Examiner* — Jean B Jeanglaude
(74) *Attorney, Agent, or Firm* — Bridgeway IP Law Group, PLLC; Jihun Kim

(57) ABSTRACT

There is provided an adversarial self-supervised learning method for a sigma delta modulation device. The device comprises a loop filter including an operational amplifier, and a circuit including a plurality of capacitors, a plurality of resistors, and a plurality of switches, which are connected to the operational amplifier; a quantization part quantizing and outputting a signal that is output from the loop filter; a feed-back converter converting a digital signal output from the quantization part into an analog signal; a memory configured to store one or more instructions; and a processor configured to control turn on or off of the plurality of switches, and adjust resistor values in an equivalent circuit of the loop filter in order to compensate a notch frequency reduced in the loop filter for satisfying a second-order transfer function.

14 Claims, 5 Drawing Sheets

100

SIGMA DELTA MODULATION DEVICE CAPABLE OF SWITCHING ORDER OF LOOP FILTER, AND LOOP FILTER FOR SIGMA DELTA MODULATION DEVICE

CROSS-REFERENCE TO RELATED APPLICATION

This application is based on and claims priority from Korean Patent Application No. 10-2023-0158614, filed on Nov. 15, 2023, the disclosure of which is incorporated herein in its entirety by reference for all purposes.

TECHNICAL FIELD

The present disclosure relates to a sigma delta modulator and a loop filter therefor.

This work was supported in part by National Research Foundation of Korea (NRF) grant funded by Korea government (MSIT) (Project No.: 2021R1F1A1056073, and Research Project Title: Development of Integrated Low-Noise Power Converter for Next-Generation Semiconductor Beamforming Antennas) and in part by Regional Innovation Strategy (RIS) through the NRF of Korea government (MOE) (Project No.: 2021RIS-004).

BACKGROUND

A sigma delta modulation method is an analog to digital conversion (ADC) or digital to analog conversion (DAC) method derived from the delta modulation method, and has anti-aliasing characteristics and high signal to noise ratio (SNR) characteristics.

The principle of delta sigma modulation is to predict the value of a signal, obtain an error, and then correct the error using the cumulated error. In this regard, when a cumulative error value is finite, the average of an input signal may be the same as the average of an output signal.

Meanwhile, a sigma delta modulator used at a receiving end of a transceiver system is used in various standards due to its noise shaping characteristics. However, due to the complexity of design and the difficulty of maintaining stability, the modulator is typically limited to operating only in a single signal bandwidth and clock frequency. For example, a communication method requiring a high SNR in a narrow bandwidth and a communication method requiring a medium SNR in a wide signal bandwidth use delta sigma modulators having different structures and orders. Therefore, since a different modulator should be implemented depending on the system, there is a problem that the size and power consumption of the system increases.

In order to solve the problem, a technology that can support multiple modes by switching the order of a loop filter of a sigma delta modulator has been proposed. However, this technology does not consider a notch frequency of a noise transfer function when switching the order.

The description provided above as a related art of the present disclosure is technical information that the inventor(s) possessed for deriving the present invention or acquired in the process of deriving the present invention, and may not necessarily said to be technology known to those of ordinary skill in the art before the present invention is filed.

SUMMARY

In view of the above, the present disclosure provides a sigma delta modulation device that can support multiple modes by switching an order of a loop filter and can compensate for a notch frequency of a noise transfer function when switching the order.

An embodiment of the present disclosure provides a loop filter for a sigma delta modulation device that can support multiple modes and can compensate for a notch frequency of a noise transfer function when switching an order.

In accordance with an aspect of the present disclosure, there is provided a loop filter for a sigma delta modulation device, the loop filter comprises: an operational amplifier; a circuit including a plurality of capacitors, a plurality of resistors, and a plurality of switches, which are connected to the operational amplifier; a memory configured to store one or more instructions; and a processor configured to execute the one or more instructions stored in the memory, wherein the instructions, when executed by the processor, cause the processor to control turn on or off of the plurality of switches so as to represent signal transfer characteristics of the loop filter for satisfying a third-order transfer function or a second-order transfer, and to adjust resistor values in an equivalent circuit of the loop filter in order to compensate a notch frequency reduced in the loop filter for satisfying the second-order transfer function.

The processor may be configured to control turn on or off of the plurality of switches so as to adjust resistor values to be reduced in the equivalent circuit of the loop filter for satisfying the second-order transfer function in order to increase the notch frequency of the loop filter, and to adjust resistance values of at least two resistors among the plurality of resistors in order to increase a signal to noise ratio (SNR) of the sigma delta modulation device.

The circuit may include a first resistor to which an input signal of the loop filter is applied at a first end thereof and which is connected at a second end thereof to an input terminal of the operational amplifier; a first capacitor connecting the first resistor and an input terminal of the operational amplifier; a second capacitor connected in series to the first capacitor; a third capacitor connected in series to the second capacitor; a second resistor, a fourth resistor, and a sixth resistor connected at first ends thereof to a first node that is a node between the first capacitor and the second capacitor; and a third resistor, a fifth resistor, and a seventh resistor connected at first ends thereof to a second node that is a node between the second capacitor and the third capacitor.

The circuit may comprise a first switch connected between the first node and the sixth resistor; a second switch connected between the second node and the seventh resistor; a third switch connected to the first node and the input terminal of the operational amplifier and configured in parallel with the first capacitor; and a fourth switch connected between the first node and the second resistor.

The at least one resistor may include the third resistor and a first additional resistor connected to the third resistor in parallel, wherein the circuit includes a fifth switch connected to a first end of the first additional resistor, and wherein the processor may be configured to control turn on the fifth switch when the loop filter is set to satisfy the second-order transfer function.

The at least two resistors may include the fourth resistor, the fifth resistor, a second additional resistor having a resistance value of the same ratio connected to the fourth resistor in series, and a third additional resistor having a resistance value of the same ratio to the fifth resistor connected to the fourth resistor in series. Wherein the circuit may include a sixth switch connected to both ends of the second additional resistor, and a seventh switch connected to both ends of the third additional resistor. Wherein the processor may be configured to control turn off the sixth switch and the seventh switch when the loop filter is set to satisfy the second-order transfer function.

The processor may be configured to control turn on the first switch, the second switch, and the fourth switch and turn off the third switch so as to be represented the signal transfer characteristics of the loop filter for satisfying the third-order transfer function.

The processor may be configured to control turn off the first switch, the second switch, and the fourth switch and turn on the third switch so as to be represented signal characteristics of the loop filter for satisfying the second-order transfer function.

The circuit may comprise a first inverting circuit and a second inverting circuit for expressing differential signals as a single end. Wherein second ends of the second resistor and the third resistor may be connected to a ground, a second end of the fourth resistor may be connected to an output terminal of the operational amplifier, a second end of the fifth resistor may be connected to an output terminal of the second inverting circuit, a second end of the sixth resistor may be connected to an output terminal of the first inverting circuit, and a second end of the seventh resistor may be connected to the third node.

The seventh resistor may be a variable resistor, and the processor may be configured to control a resistance value of the seventh resistor in order to adjust a change in bandwidth according to turning on or off of the plurality of switches.

In accordance with another aspect of the present disclosure, there is provided a sigma delta modulation device capable of switching an order of a loop filter, the device comprises: a loop filter including an operational amplifier, and a circuit including a plurality of capacitors, a plurality of resistors, and a plurality of switches, which are connected to the operational amplifier; a quantization part quantizing and outputting a signal that is output from the loop filter; a feed-back converter converting a digital signal output from the quantization part into an analog signal; a memory configured to store one or more instructions; and a processor configured to execute the one or more instructions stored in the memory, wherein the instructions, when executed by the processor, cause the processor to control turn on or off of the plurality of switches so as to represent signal transfer characteristics of the loop filter for satisfying a third-order transfer function or a second-order transfer, and to adjust resistor values in an equivalent circuit of the loop filter in order to compensate a notch frequency reduced in the loop filter for satisfying the second-order transfer function.

The processor may be configured to control turn on or off of the plurality of switches so as to adjust resistor values to be reduced in the equivalent circuit of the loop filter for satisfying the second-order transfer function in order to increase the notch frequency of the loop filter, and to adjust resistance values of at least two resistors among the plurality of resistors in order to increase an SNR (signal to noise ratio) of the sigma delta modulation device.

The circuit may includes: a first resistor to which an input signal of the loop filter is applied at a first end thereof and which is connected at a second end thereof to an input terminal of the operational amplifier; a first capacitor connecting the first resistor and an input terminal of the operational amplifier; a second capacitor connected in series to the first capacitor; a third capacitor connected in series to the second capacitor; a second resistor, a fourth resistor, and a sixth resistor connected at first ends thereof to a first node that is a node between the first capacitor and the second capacitor; and a third resistor, a fifth resistor, and a seventh resistor connected at first ends thereof to a second node that is a node between the second capacitor and the third capacitor.

The circuit may comprise a first switch connected between the first node and the sixth resistor; a second switch connected between the second node and the seventh resistor; a third switch connected to the first node and the input terminal of the operational amplifier and configured in parallel with the first capacitor; and a fourth switch connected between the first node and the second resistor.

The at least one resistor may include the third resistor and a first additional resistor connected to the third resistor in parallel. Wherein the circuit may include a fifth switch connected to a first end of the first additional resistor, and the processor may be configured to control turn on the fifth switch when the loop filter is set to satisfy the second-order transfer function.

The at least two resistors may include the fourth resistor, the fifth resistor a second additional resistor having a resistance value of the same ratio connected to the fourth resistor in series, and a third additional resistor having a resistance value of the same ratio to the fifth resistor connected to the fourth resistor in series. Wherein the circuit may include a sixth switch connected to both ends of the second additional resistor, and a seventh switch connected to both ends of the third additional resistor, and the processor may be configured to control turn off the sixth switch and the seventh switch when the loop filter is set to satisfy the second-order transfer function.

The processor may be configured to control turn on the first switch, the second switch, and the fourth switch and turn off the third switch so as to be represented the signal transfer characteristics of the loop filter for satisfying the third-order transfer function.

The processor may be configured to control turn off the first switch, the second switch, and the fourth switch and turn on the third switch so as to be represented signal characteristics of the loop filter for satisfying the second-order transfer function.

The circuit may comprise a first inverting circuit and a second inverting circuit for expressing differential circuits as a single end. Wherein second ends of the second resistor and the third resistor may be connected to a ground, a second end of the fourth resistor may be connected to an output terminal of the operational amplifier, a second end of the fifth resistor may be connected to an output terminal of the second inverting circuit, a second end of the sixth resistor may be connected to an output terminal of the first inverting circuit, and a second end of the seventh resistor may be connected to the third node.

The seventh resistor may be a variable resistor, and the processor may be configured to control a resistance value of the seventh resistor in order to adjust a change in bandwidth according to turning on or off of the plurality of switches.

According to an embodiment of the present disclosure, in the case of switching an order of a loop filter from high to low dimensions, a notch frequency of a noise transfer function shifts to a low frequency, overcoming the limitation of not being able to achieve wide bandwidth characteristics despite having a high oversampling ratio (OSR). According to an embodiment of the present disclosure, by implementing a continuous-time sigma delta modulation device that may operate in dual or multiple modes, it is possible to achieve a multi-mode operation by reconfiguring the structure of the loop filter according to a frequency instead of using an existing method of adjusting a time constant by changing a resistor and a capacitor. Thereby, the present disclosure can maximize power efficiency in the sigma delta modulation device.

DETAILED DESCRIPTION

Figure 1:
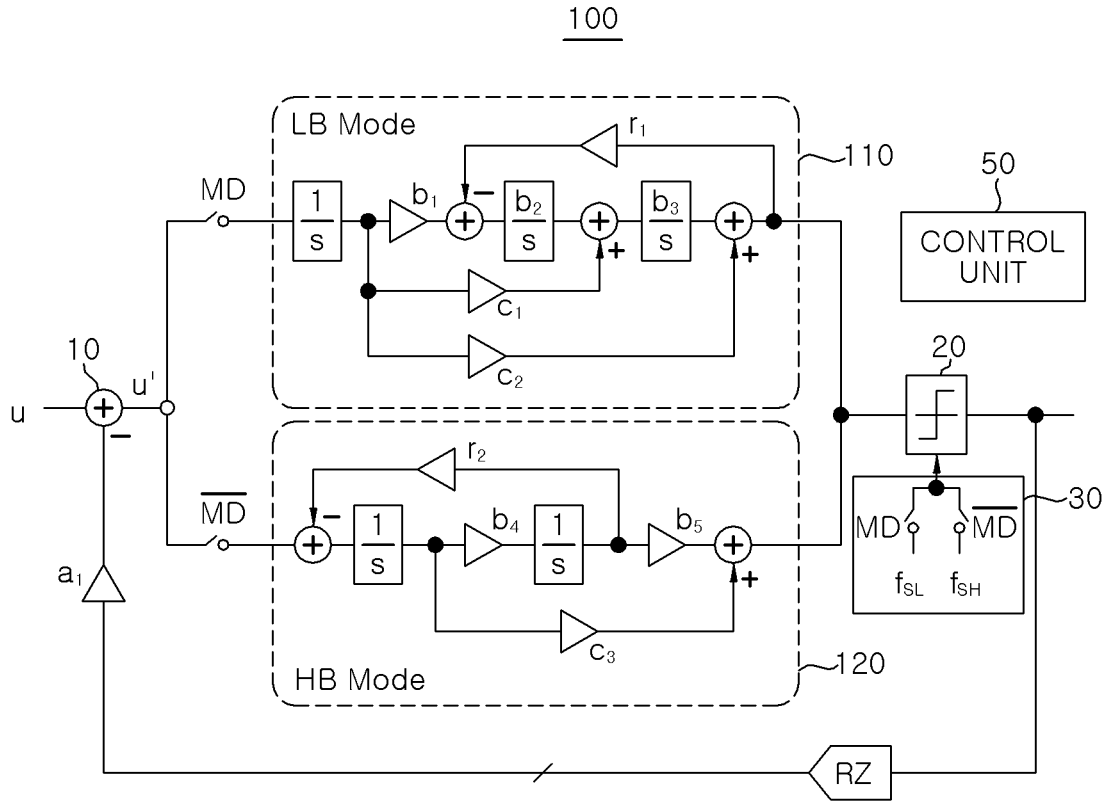
FIG. 1 is a configuration diagram showing a sigma delta modulation device capable of switching the order of a loop filter according to an embodiment of the present disclosure.

The advantages and features of the embodiments and the methods of accomplishing the embodiments will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

Terms used in the present specification will be briefly described, and the present disclosure will be described in detail.

In terms used in the present disclosure, general terms currently as widely used as possible while considering functions in the present disclosure are used. However, the terms may vary according to the intention or precedent of a technician working in the field, the emergence of new technologies, and the like. In addition, in certain cases, there are terms arbitrarily selected by the applicant, and in this case, the meaning of the terms will be described in detail in the description of the corresponding invention. Therefore, the terms used in the present disclosure should be defined based on the meaning of the terms and the overall contents of the present disclosure, not just the name of the terms.

When it is described that a part in the overall specification "includes" a certain component, this means that other components may be further included instead of excluding other components unless specifically stated to the contrary.

In addition, a term such as a "unit" or a "portion" used in the specification means a software component or a hardware component such as FPGA or ASIC, and the "unit" or the "portion" performs a certain role. However, the "unit" or the "portion" is not limited to software or hardware. The "portion" or the "unit" may be configured to be in an addressable storage medium, or may be configured to reproduce one or more processors. Thus, as an example, the "unit" or the "portion" includes components (such as software components, object-oriented software components, class components, and task components), processes, functions, properties, procedures, subroutines, segments of program code, drivers, firmware, microcode, circuits, data, database, data structures, tables, arrays, and variables. The functions provided in the components and "unit" may be combined into a smaller number of components and "units" or may be further divided into additional components and "units".

Hereinafter, the embodiment of the present disclosure will be described in detail with reference to the accompanying drawings so that those of ordinary skill in the art may easily implement the present disclosure. In the drawings, portions not related to the description are omitted in order to clearly describe the present disclosure.

A sigma delta modulation device operated in multiple modes is widely used in a wireless communication, a sensor network, and a power conversion system due to its excellent performance. The multi-mode sigma delta modulation device has high-resolution conversion, flexible bandwidth scalability, and improved power efficiency. In order to implement these multiple modes, discrete-time and continuous-time types are being implemented.

The multi-mode operation of the sigma delta modulation device in terms of bandwidth and resolution may generally be implemented by adjusting a sampling frequency. In the discrete-time sigma delta modulation device, the coefficient of a loop filter is scaled according to a change in clock frequency, and the coefficient is set by a capacitor ratio, so it is suitable for the multiple modes. However, the discrete-time sigma delta modulation device has a drawback that much power is consumed in an operational amplifier, so efficiency is low.

Further, the continuous-time sigma delta modulation device exhibits high efficiency due to the low power consumption requirements of the operational amplifier, but has a drawback that resistance and capacitor values should be reset when the clock frequency changes.

Thus, an embodiment of the present disclosure provides a sigma delta modulation device that can support multiple modes by switching an order of a loop filter and can compensate for a notch frequency of a noise transfer function when switching the order.

Further, an embodiment of the present disclosure provides a sigma delta modulation device that can support multiple modes by switching an order of a loop filter and can optimize an SNR.

Hereinafter, an embodiment of the present disclosure will be described in detail with reference to the accompanying drawings.

FIG. 1 is a configuration diagram showing a sigma delta modulation device capable of switching the order of a loop filter according to an embodiment of the present disclosure.

As shown in FIG. 1, the sigma delta modulation device 100 capable of switching the order of the loop filter according to an embodiment of the present disclosure may include loop filters 110 and 120, a summing part 10, a quantization part 20, a switching unit 30, a feed-back converter RZ (or feedback part) 40, and a control unit 50.

First, the summing part 10 may transmit a signal u' obtained by subtracting an output signal of the feed-back converter RZ from an input signal u input from the outside to the first loop filter 110 or the second loop filter 120.

That is, by transmitting an error between the input signal u and a signal converting the output signal v back to analog to the first loop filter 110 or the second loop filter 120, the error may be accumulated in the first loop filter 110 or the second loop filter 120 and thereby the error may be corrected.

Here, the loop filter 10 may integrate and output a difference u' between the input signal u and the analog signal. For example, the difference u' between the input signal u and the analog signal may be expressed as the error, and the error may be accumulated through one or more integrators. At this time, the loop filters 110 and 120 may include integrators corresponding to a desired order. For example, if the loop filter is implemented as a second-order loop filter, two integrators may be included. If the loop filter is implemented as a third-order loop filter, three integrators may be included. Here, the loop filters 110 and 120 may be implemented in a feed-back form but may also be implemented in a feed-forward form.

The loop filters 110 and 120 may have conditionally stable characteristics because state stability decreases as the order increases. Thus, as the order increases, stable operation may be made only through a combination of specific sampling frequency (Fs) and specific loop gain coefficients. Therefore, a fixed signal bandwidth may be generally used to maintain state stability.

The quantization part 20 may quantize and output a signal that is output from each of the loop filters 110 and 120, and may quantize the signal according to the sampling frequency Fs. At this time, the quantization part 20 may compare the output signal of each of the loop filters 110 and 129 with a reference value and then output the output signal v.

The feed-back converter RZ may convert a digital signal output from the quantization part 20 into an analog signal, and output the converted analog signal. The analog signal output through the converter RZ may be implemented with a 1-bit DAC (digital to analogue convertor), but be implemented with more bits.

Although FIG. 1 shows that the feed-back converter RZ is a RZ (return-to-zero) type converter, this is only an example. The feed-back converter may be implemented in a NRZ (Non-return-to-zero) type depending on the feed-back form of the sigma delta modulation device 100.

In the case of implementing a configuration fed back by the feed-back converter RZ in the NRZ type, a separate feed-back loop may be included at the output v' of the loop filter to compensate for excess loop delay (ELD). That is, in addition to a comparison part al connected to the summer 20 that outputs the error between the output and the input signal u, an additional comparison part may be applied to the separate feed-back loop. Since FIG. 1 is only an example, the quantization part 20 and the feed-back converter RZ may be applied differently depending on implementation and an additional feed-back loop may be provided between the integrators of the loop filters 110 and 120. In addition, since a separate digital filter may be further included at a rear end of the output v, the delta sigma modulation device 100 including the loop filters 110 and 120 according to an embodiment of the present disclosure need not be interpreted as being limited to the conceptual diagrams of FIGS. 1 and 2. However, for the convenience of explanation, the description will be made on the assumption that the feed-back converter is implemented as the RZ-type feed-back converter RZ that may not compensate for excess loop delay.

A switching unit 30 is a means for determining the operating speed (sampling frequency) of the quantization part 20 and the order of the loop filter. According to an embodiment of the present disclosure, through the operation of the switching unit 30, the operating frequency of the delta sigma modulation device may be set, the signal transfer characteristics of the loop filter may be set to satisfy a third-order transfer function, or the signal transfer characteristics of the loop filter may be set to satisfy a second-order transfer function.

The control unit 50 provides control signals to the switching unit 30 and controls the operation of the switching unit 30. The control unit 50 may include memory and a processor. The memory store computer program instructions for controlling the operation of the switching unit 30, and the processor is configured to execute the computer program instructions to output control signals.

First, an example of configuring a third-order loop filter will be described as follows.

In FIG. 1, reference numeral 110 denoting a first loop filter is an example of the third-order loop filter, which may include a first integrator 1/s, a second integrator $b_2$/s, and a third integrator $b_3$/s. The output of the first integrator 1/s may be fed forward to have a coefficient c1 and then added to the output of the second integrator $b_2$/s.

Further, the output of the first integrator 1/s may be fed back to have a coefficient c2 and then added to the output of the third integrator $b_3$/s.

Here, the output of the third-order loop filter 110 may be fed back to have a coefficient $r_1$ and then subtracted from the output of the first integrator 1/s.

The third-order loop filter 110 may derive a transfer function having three poles and two zero points.

By removing one integrator from the third-order loop filter 110, it may be switched to the second-order loop filter having two poles.

As shown in FIG. 1, reference numeral 120 denoting a second loop filter is an example of the second-order loop filter, which may include two integrators 1/s.

It may be configured to have one feed-forward loop and one feed-back loop through two integrators 1/s.

The second-order loop filter 120 may derive a transfer function having two poles and one zero point.

The sigma delta modulation device 100 according to an embodiment of the present disclosure is implemented to enable order-switching to the third-order loop filter 110 and the second-order loop filter 120 on the basis of the mode selection operation of the switching unit 30.

As shown in FIG. 1, when the sampling frequency is low (in the case of $f_{SL}$), the oversampling ratio (OSR) of the sigma delta modulation device 100 is low, so the order of the loop filter should be increased to secure the high SNR. When the sampling frequency is high (in the case of $f_{SH}$), the oversampling ratio of the sigma delta modulation device 100 is high, so a desired SNR may be obtained even if the order of the loop filter is lowered.

By using this strategy, it is possible to overcome the drawback of the conventional multi-mode sigma delta modulator where the SNR decreases in a low sampling frequency region. Further, if a high-order loop filter is used at a high sampling frequency, the signal delay increases as the order increases, making the system unstable. However, according to the present disclosure, a low-order loop filter is used at the high sampling frequency, enabling stable operation.

Hereinafter, the order-switching between the second-order loop filter 120 and the third-order loop filter 110 will be described in more detail.

Figure 2:
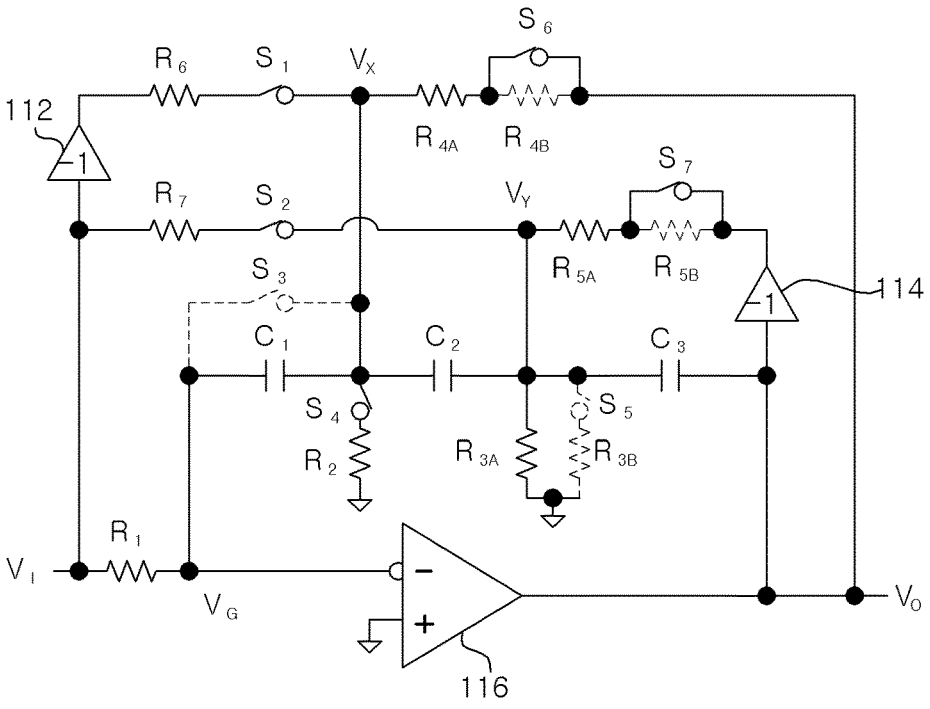
FIG. 2 is a circuit diagram explaining an operation of the loop filter of the sigma delta modulation device according to an embodiment of the present disclosure.
Figure 3:
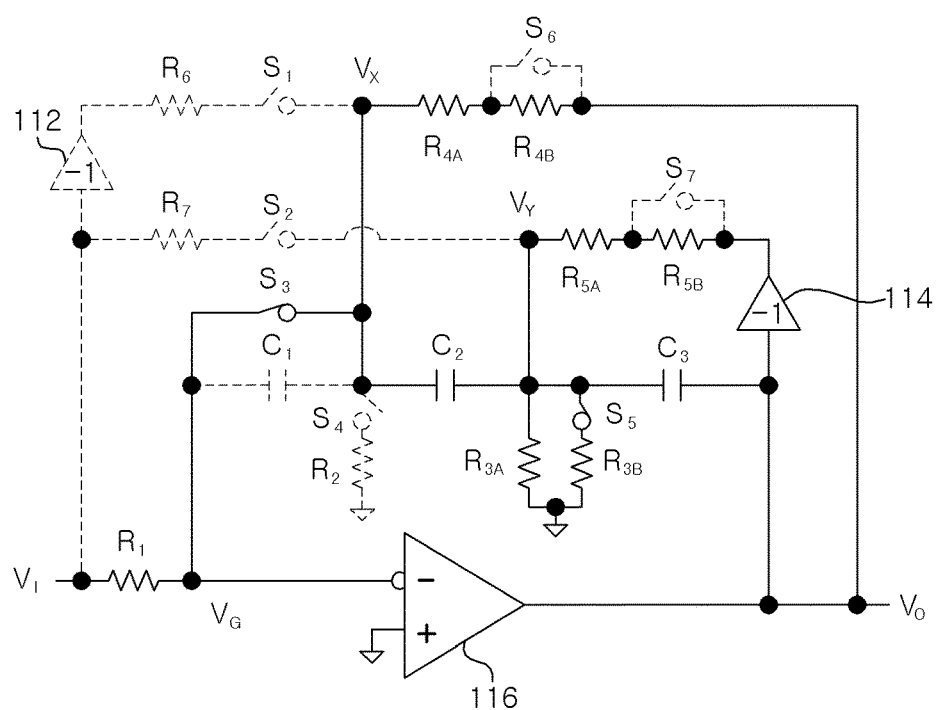
FIG. 3 is a circuit diagram explaining another operation of the loop filter of the sigma delta modulation device according to an embodiment of the present disclosure.

FIG. 2 is a circuit diagram explaining an operation of the loop filter of the sigma delta modulation device according to an embodiment of the present disclosure, for example, the circuit operation of the third-order loop filter 110, and FIG. 3 is a circuit diagram explaining another operation of the loop filter of the sigma delta modulation device according to an embodiment of the present disclosure, for example, the circuit operation of the second-order loop filter 120.

The proposed loop filters 110 and 120 may select a third-order structure and a second-order structure according to the sampling frequency of the sigma delta modulation device 100. As described above, the third-order loop filter 110 is used when the oversampling ratio is low, and the second-order loop filter 120 is used when the oversampling ratio is high. For example, the control unit 50 checks the sampling frequency of the sigma delta modulation device 100 and controls the operation of the third-order loop filter 110 to operate when the oversampling ratio is below a predetermined threshold, and controls the operation of the third-order loop filter 110 to operate when the oversampling ratio exceeds the predetermined threshold.

In order to change the third-order loop filter 110 of FIG. 2 to the second-order loop filter 120 of FIG. 3, a first capacitor $C_1$, a second resistor $R_2$, a sixth resistor $R_6$ and a seventh resistor $R_7$ are removed from the existing connection through a switch. The changed loop filter has a second-order transfer function due to the two capacitors $C_2$ and $C_3$ connected in series.

This will be described in more detail as follows.

First, referring to FIG. 2, the loop filter 110 may include a circuit including a single operational amplifier 116, a plurality of capacitors $C_1$ to $C_3$, a plurality of resistors $R_1$ to $R_7$, and a plurality of switches $S_1$ to $S_7$, which are connected to the operational amplifier 116.

Specifically, the circuit may include a first resistor $R_1$ to which the input signal of the loop filter is applied at one end thereof and which is connected at the other end to an input terminal of the operational amplifier, a first capacitor $C_1$ connecting the first resistor $R_1$ and the input terminal of the operational amplifier 116 in parallel, a second capacitor $C_2$ connected to the first capacitor $C_1$ in series, a third capacitor $C_3$ connected to the second capacitor $C_2$ in series, a second resistor $R_2$ connecting the first capacitor $C_1$ and the second capacitor $C_2$ in parallel, and a third resistor $R_{3A}$ connecting the second capacitor $C_2$ and the third capacitor $C_3$ in parallel. A first additional resistor $R_{3B}$ may be connected to the third resistor $R_{3A}$ in parallel, and a fifth switch $S_5$ may be connected to one end of the first additional resistor $R_{3B}$.

Further, the circuit may include a second additional resistor $R_{4B}$ connected to a fourth resistor $R_{4A}$ in series, a third additional resistor $R_{5B}$ connected to a fifth resistor $R_{5A}$ in series, a sixth switch $S_6$ connected to both ends of a second additional resistor $R_{4B}$, and a seventh switch $S_7$ connected to both ends of the third additional resistor $R_{5B}$.

The operational amplifier 116 may include a first input terminal and a second input terminal, and may receive differential input to operate as a differential amplifier.

Here, the control unit 50 configures the loop filter to satisfy a third-order transfer function or a second-order transfer function by controlling the on or off operation of the plurality of switches within the loop filter to adjust its signal transmission characteristics.

Specifically, the circuit may include the first capacitor $C_1$, the second capacitor $C_2$, and the third capacitor $C_3$, which are connected in series between the first input terminal of the operational amplifier 116 and the output terminal $V_o$ of the operational amplifier 116.

Here, the circuit may include a first resistor $R_1$ which is connected at one end thereof to a third node $V_f$ to which the input signal of the loop filter 110 is applied and which is connected at the other end to the first input terminal of the operational amplifier 116, a second resistor $R_2$, a fourth resistor $R_4$, and a sixth resistor $R_6$ which are connected at first ends thereof to a node between the first capacitor $C_1$ and the second capacitor $C_2$, that is, a first node $V_x$, and a third resistor $R_3$, a fifth resistor, and a seventh resistor which are connected at first ends thereof to a node between the second capacitor $C_2$ and the third capacitor $C_3$, that is, a second node $V_y$.

The circuit may include a first inverting circuit 112 and a second inverting circuit 114. The first inverting circuit 112 and the second inverting circuit 114 express signals on a differential side when implemented as differential circuits. In FIGS. 2 and 3, the differential signals are expressed in a single-ended manner.

The first inverting circuit 112 and the second inverting circuit 114 may provide a negative signal within the loop filter.

The other end of each of the second resistor $R_2$ and the third resistor $R_3$ may be connected to a ground, the other end of the fourth resistor $R_4$ may be connected to the output terminal $V_o$ of the operational amplifier 116, the other end of the fifth resistor $R_5$ may be connected to the output terminal of the second inverting circuit 114, the other end of the sixth resistor $R_6$ may be connected to the output terminal of the first inverting circuit 112, and the other end of the seventh resistor $R_7$ may be connected to the third node $V_f$.

Here, the circuit may further include a first switch $S_1$ connected between the first node $V_x$ and the sixth resistor $R_6$, a second switch $S_2$ connected between the second node $V_y$ and the seventh resistor $R_7$, a third switch $S_3$ connected to the first node $V_x$ and the input terminal of the operational amplifier 116 and configured in parallel with the first capacitor $C_1$, and a fourth switch $S_4$ connected between the first node $V_x$ and the second resistor $R_2$.

At this time, the circuit may set the signal transfer characteristics of the first loop filter 110 to satisfy the third-order transfer function by turning on the first switch $S_1$, the second switch $S_2$, and the fourth switch $S_4$ and turning off the third switch $S_3$.

Further, the control unit 50 is configured to control the signal transfer characteristics of the second loop filter 120 to satisfy the second-order transfer function by turning off the first switch $S_1$, the second switch $S_2$, and the fourth switch $S_4$ and turning on the third switch $S_3$.

Specifically, referring to FIG. 3, the control unit 50 turns off the first switch $S_1$ to remove the sixth resistor $R_6$ and the first inverting circuit 130 from the circuit, and, the control unit 50 turns off the second switch $S_2$ to remove the seventh resistor $R_7$.

Further, when the control unit 50 turns on the third switch $S_3$, the influence of the first capacitor $C_1$ may be removed. When the control unit 50 turns off the fourth switch $S_4$, the second resistor $R_2$ may be removed.

At this time, if connection between the resistor and the capacitor is simply changed, the notch frequency of the noise transfer function is shifted to a frequency lower than the third-order loop filter 110, so that the second-order loop filter 120 may not have wide bandwidth characteristics even though it has the high oversampling ratio.

Figure 4:
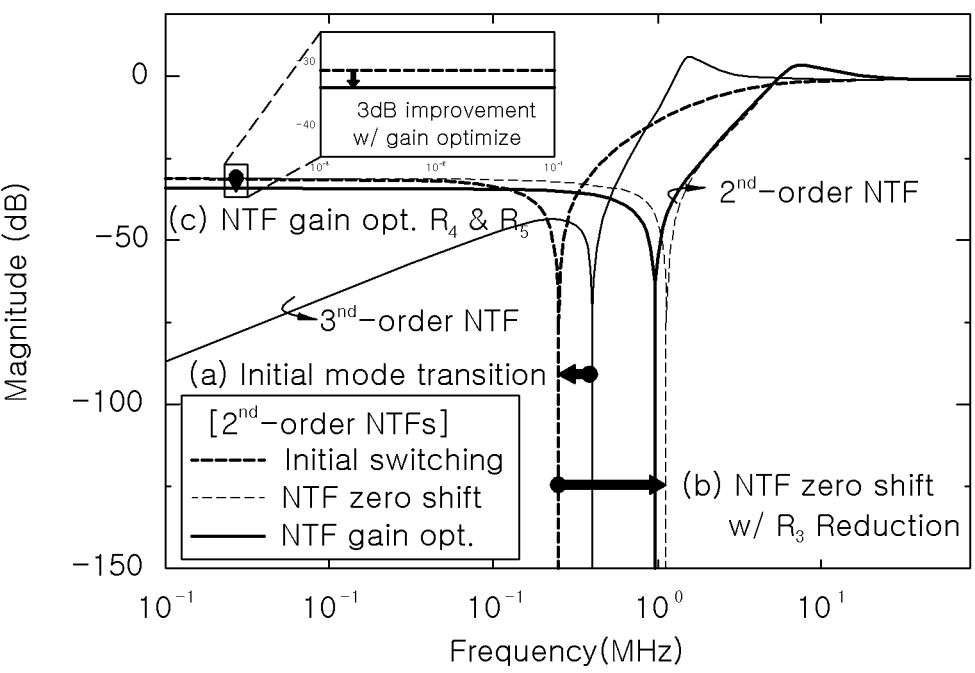
FIG. 4 is a graph illustrating a notch frequency shift according to the order reconfiguration operation of the loop filter of the sigma delta modulation device.

FIG. 4 is a graph illustrating a notch frequency shift as the order is switched (reconfigured) from the third-order loop filter 110 of the sigma delta modulation device to the second-order loop filter 120.

The notch frequency in the order-switched loop filter may be defined as the following [Equation 1].

$$f_n = \frac{1}{2\pi} \cdot \sqrt{\frac{1}{C^2 R_{4A} R_Y}}$$ [Equation 1]

In [Equation 1], $R_Y$ represents a resistance value connected in parallel to the $V_y$ node, and may be given as $1/(1/R3A+1/R5A+1/R7)$ in the third-order loop filter 110 structure.

That is, in order to solve a problem where the notch frequency is lowered, according to an embodiment of the present disclosure, at least one resistor among a plurality of resistors, for example, the first additional resistor $R_{3B}$ of FIG. 2 may be connected in parallel to the third resistor $R_{3A}$ to reduce the resistance of the third resistor $R_{3A}$. Specifically, when the first switch $S_1$, the second switch $S_2$, and the fourth switch $S_4$ are turned off and the third switch $S_3$ is turned on so that a link function of the second-order loop filter 120 satisfies the second-order transfer function, the control unit 50 controls the fifth switch $S_5$ to be turn on, thus reducing the resistance value of the third resistor $R_{3A}$.

When the resistance value between the third resistor $R_{3A}$ and the first additional resistor $R_{3B}$ is lowered, as shown in FIG. 4(b), $R_Y$ of the notch frequency decreases and the notch frequency increases.

With only this adjustment, the second-order loop filter 120 may obtain the desired SNR at the high oversampling ratio. However, in addition, according to the embodiment of the present disclosure, the SNR may be increased to approximately 3 dB by adjusting the resistance values of the fourth resistor $R_{4A}$ and the fifth resistor $R_{5A}$. To this end, when the second additional resistor $R_{4B}$ and the third additional resistor $R_{5B}$ are connected, respectively, to the fourth resistor $R_{4A}$ and the fifth resistor $R_{5B}$ to increase at the same ratio, and the sixth switch $S_6$ and the seventh switch $S_7$ are controlled to be off, as shown in FIG. 4(c), an NTF (noise transfer function) gain is reduced, making it possible to have an optimal SNR.

Through such a reconfiguration conversion, the configuration of the notch frequency in the second-order loop filter 120 changes. That is, in [Equation 1], $R_{4A}$ is changed to $R_{4A}+R_{4B}$, and $R_Y$ is changed to $1/(1/(R_{3A}\|R_{3B})+1/(R_{5A}+R_{5B}))$.

Through such a process, the notch-frequency location in the second-order loop filter 120 may be adjusted, which makes it possible to implement the multi-mode sigma delta modulation device that may be applied to applications with various signal bandwidths.

Since the notch frequency may not be changed in the existing sigma delta modulation device, it is difficult to apply the device to various signal bandwidths. Further, since the existing technology uses the second-order loop filter at a low frequency and uses the third-order loop filter at a high frequency, a reduction in SNR at the low frequency may not be avoided. Further, the use of the third-order loop filter at the high frequency increases instability due to signal delay.

In contrast, according to an embodiment of the present disclosure, the notch frequency of the second-order loop filter may be effectively changed.

Figure 5B:
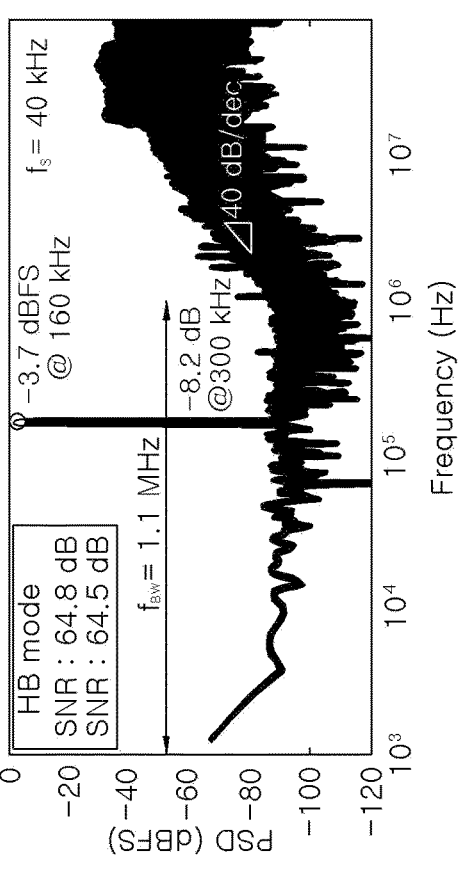
FIGS. 5A and 5B are graphs illustrating output spectrum characteristics of the sigma delta modulation device according to an embodiment of the present disclosure.
Figure 5A:
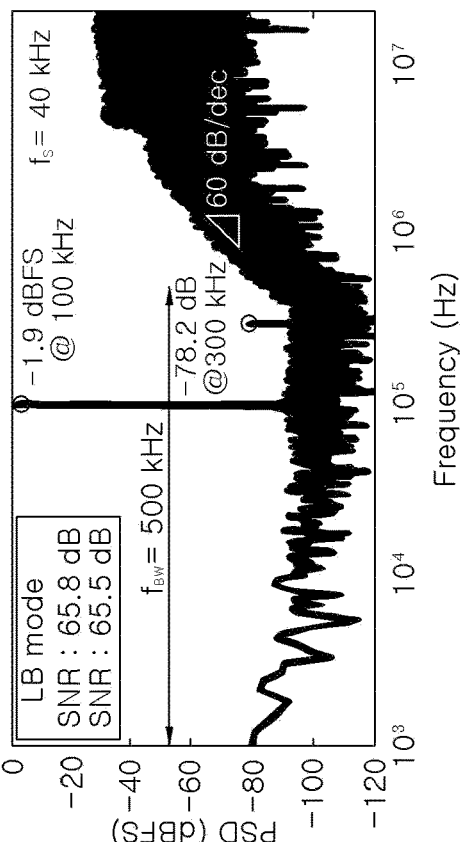

FIG. 5 is a graph illustrating output spectrum characteristics of the sigma delta modulation device according to an embodiment of the present disclosure.

In the output spectrums of the third-order and second-order loop filters implemented through the proposed loop filter, it can be seen that the output noise of the third-order loop filter increases to 60 dB/dec at 40 MHz sampling frequency and 0.5 MHz signal bandwidth, and the output noise of the second-order loop filter increases to 40 dB/dec at 160 MHz sampling frequency and 1.1 MHz signal bandwidth. With these characteristics, it can be confirmed that the proposed third-order and second-order loop filters are properly implemented.

Figure 6:
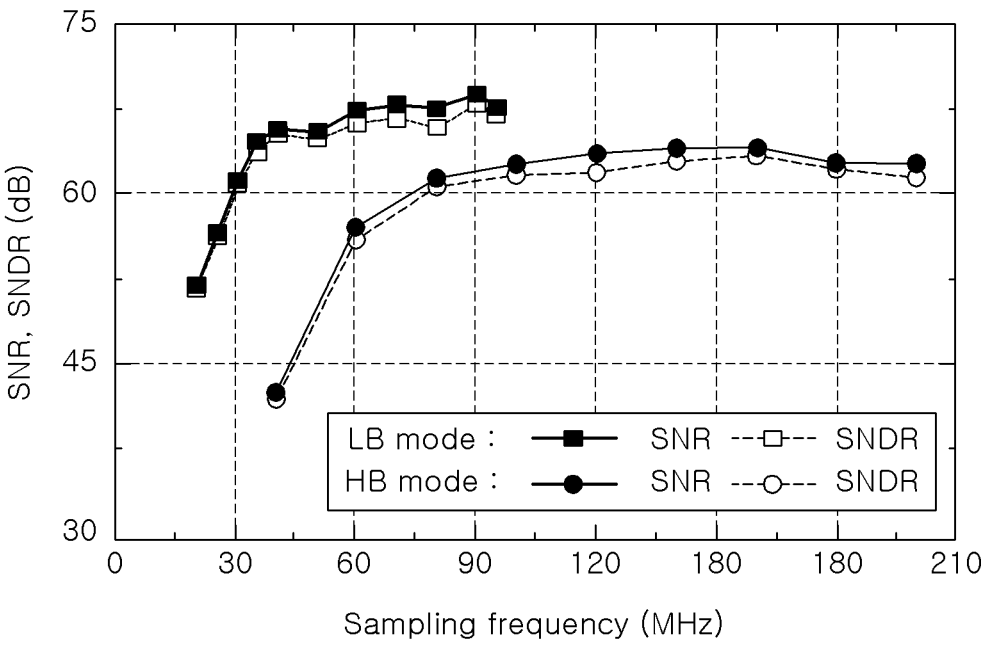
FIG. 6 is a graph illustrating SNR characteristics and SNDR (signal to noise and distortion ratio) characteristics as the function of the frequency of the sigma delta modulation device according to an embodiment of the present disclosure.

FIG. 6 is a graph illustrating SNR characteristics and SNDR (signal to noise and distortion ratio) characteristics as the function of the frequency of the sigma delta modulation device according to an embodiment of the present disclosure.

As shown in FIG. 6, according to an embodiment of the present disclosure, it can be seen that the third-order loop filter has the SNR of 60 dB or more from 30 to 95 MHz, and the second-order loop filter has the SNR of 60 dB or more from 80 to 200 MHz.

Therefore, the proposed multi-mode sigma delta modulation device may be designed to have the high SNR in a region from 30 to 200 MHz by changing the structure of LF. Further, it can be confirmed that a desired signal bandwidth performance can be secured by changing the notch frequency through the change of R3, R4, and R5 without the fine adjustment of the resistance value and the capacitor values, which is performed to match the time constant in existing papers.

As described above, according to an embodiment of the present disclosure, in the case of switching an order of a loop filter from high to low dimensions, a notch frequency of a noise transfer function shifts to a low frequency, overcoming the limitation of not being able to achieve wide bandwidth characteristics despite having a high oversampling ratio. In addition, according to an embodiment of the present disclosure, by implementing a continuous-time sigma delta modulation device that may operate in dual or multiple modes, it is possible to implement a sigma delta modulation device that can reconfigure the structure of the loop filter according to a frequency without using an existing method of adjusting a time constant by changing a resistor and a capacitor.

Combinations of steps in each flowchart attached to the present disclosure may be executed by computer program instructions. Since the computer program instructions can be mounted on a processor of a general-purpose computer, a special purpose computer, or other programmable data processing equipment, the instructions executed by the processor of the computer or other programmable data processing equipment create a means for performing the functions described in each step of the flowchart. The computer program instructions can also be stored on a computer-usable or computer-readable storage medium which can be directed to a computer or other programmable data processing equipment to implement a function in a specific manner. Accordingly, the instructions stored on the computer-usable or computer-readable recording medium can also produce an article of manufacture containing an instruction means which performs the functions described in each step of the flowchart. The computer program instructions can also be mounted on a computer or other programmable data processing equipment. Accordingly, a series of operational steps are performed on a computer or other programmable data processing equipment to create a computer-executable process, and it is also possible for instructions to perform a computer or other programmable data processing equipment to provide steps for performing the functions described in each step of the flowchart.

In addition, each step may represent a module, a segment, or a portion of codes which contains one or more executable instructions for executing the specified logical function(s). It should also be noted that in some alternative embodiments, the functions mentioned in the steps may occur out of order. For example, two steps illustrated in succession may in fact be performed substantially simultaneously, or the steps may sometimes be performed in a reverse order depending on the corresponding function.

The above description is merely exemplary description of the technical scope of the present disclosure, and it will be understood by those skilled in the art that various changes and modifications can be made without departing from original characteristics of the present disclosure. Therefore, the embodiments disclosed in the present disclosure are intended to explain, not to limit, the technical scope of the present disclosure, and the technical scope of the present disclosure is not limited by the embodiments. The protection scope of the present disclosure should be interpreted based on the following claims and it should be appreciated that all technical scopes included within a range equivalent thereto are included in the protection scope of the present disclosure.

What is claimed is:

1. A loop filter for a sigma delta modulation device, the loop filter comprising:

an operational amplifier;

a circuit including a plurality of capacitors, a plurality of resistors, and a plurality of switches, which are connected to the operational amplifier;

a memory configured to store one or more instructions; and a processor configured to execute the one or more instructions stored in the memory, wherein the one or more instructions, when executed by the processor, cause the processor to;

control turn on or off of the plurality of switches so as to represent signal transfer characteristics of the loop filter for satisfying a third-order transfer function or a second-order transfer function, and to adjust resistor values in an equivalent circuit of the loop filter in order to compensate a notch frequency reduced in the loop filter for satisfying the second-order transfer function, wherein the circuit includes:

a first resistor to which an input signal of the loop filter is applied at a first end thereof and which is connected at a second end thereof to an input terminal of the operational amplifier;

a first capacitor connecting the first resistor and an input terminal of the operational amplifier;

a second capacitor connected in series to the first capacitor;

a third capacitor connected in series to the second capacitor;

a second resistor, a fourth resistor, and a sixth resistor connected at first ends thereof to a first node that is a node between the first capacitor and the second capacitor; and a third resistor, a fifth resistor, and a seventh resistor connected at first ends thereof to a second node that is a node between the second capacitor and the third capacitor, wherein the circuit further comprises:

a first switch connected between the first node and the sixth resistor;

a second switch connected between the second node and the seventh resistor;

a third switch connected to the first node and the input terminal of the operational amplifier and configured in parallel with the first capacitor; and a fourth switch connected between the first node and the second resistor, wherein the plurality of resistors includes the third resistor and a first additional resistor connected to the third resistor in parallel, wherein the circuit includes a fifth switch connected to a first end of the first additional resistor, and wherein the processor is configured to control turn on the fifth switch when the loop filter is set to satisfy the second-order transfer function.

2. The loop filter of claim 1, wherein the processor is configured to control turn on or off of the plurality of switches so as to adjust resistor values to be reduced in the equivalent circuit of the loop filter for satisfying the second-order transfer function in order to increase the notch frequency of the loop filter, and to adjust resistance values of at least two resistors among the plurality of resistors in order to increase a signal to noise ratio (SNR) of the sigma delta modulation device.

3. The loop filter of claim 2, wherein the at least two resistors include the fourth resistor, the fifth resistor, a second additional resistor having a resistance value of a first same ratio connected to the fourth resistor in series, and a third additional resistor having a resistance value of a second same ratio to the fifth resistor connected to the fourth resistor in series, wherein the circuit includes a sixth switch connected to both ends of the second additional resistor, and a seventh switch connected to both ends of the third additional resistor, and wherein the processor is configured to control turn off the sixth switch and the seventh switch when the loop filter is set to satisfy the second-order transfer function.

4. The loop filter of claim 1, wherein the processor is configured to control turn on the first switch, the second switch, and the fourth switch and turn off the third switch so as to be represented the signal transfer characteristics of the loop filter for satisfying the third-order transfer function.

5. The loop filter of claim 1, wherein the processor is configured to control turn off the first switch, the second switch, and the fourth switch and turn on the third switch so as to be represented signal characteristics of the loop filter for satisfying the second-order transfer function.

6. The loop filter of claim 1, wherein the circuit further comprises a first inverting circuit and a second inverting circuit for expressing differential signals as a single end, and wherein second ends of the second resistor and the third resistor are connected to a ground, a second end of the fourth resistor is connected to an output terminal of the operational amplifier, a second end of the fifth resistor is connected to an output terminal of the second inverting circuit, a second end of the sixth resistor is connected to an output terminal of the first inverting circuit, and a second end of the seventh resistor is connected to a third node to which the input signal is applied.

7. The loop filter of claim 1, wherein the seventh resistor is a variable resistor, and wherein the processor is configured to control a resistance value of the seventh resistor in order to adjust a change in bandwidth according to turning on or off of the plurality of switches.

8. A sigma delta modulation device, the device comprising:

a loop filter including an operational amplifier, and a circuit including a plurality of capacitors, a plurality of resistors, and a plurality of switches, which are connected to the operational amplifier;

a quantization part quantizing and outputting a signal that is output from the loop filter;

a feed-back converter converting a digital signal output from the quantization part into an analog signal;

a memory configured to store one or more instructions; and a processor configured to execute the one or more instructions stored in the memory, wherein the one or more instructions, when executed by the processor, cause the processor to control turn on or off of the plurality of switches so as to represent signal transfer characteristics of the loop filter for satisfying a third-order transfer function or a second-order transfer function, and to adjust resistor values in an equivalent circuit of the loop filter in order to compensate a notch frequency reduced in the loop filter for satisfying the second-order transfer function, wherein the circuit includes:

a first resistor to which an input signal of the loop filter is applied at a first end thereof and which is connected at a second end thereof to an input terminal of the operational amplifier;

a first capacitor connecting the first resistor and an input terminal of the operational amplifier;

a second capacitor connected in series to the first capacitor;

a third capacitor connected in series to the second capacitor;

a second resistor, a fourth resistor, and a sixth resistor connected at first ends thereof to a first node that is a node between the first capacitor and the second capacitor; and a third resistor, a fifth resistor, and a seventh resistor connected at first ends thereof to a second node that is a node between the second capacitor and the third capacitor, wherein the circuit further comprises:

a first switch connected between the first node and the sixth resistor;

a second switch connected between the second node and the seventh resistor;

a third switch connected to the first node and the input terminal of the operational amplifier and configured in parallel with the first capacitor; and a fourth switch connected between the first node and the second resistor, wherein the plurality of resistors includes the third resistor and a first additional resistor connected to the third resistor in parallel, wherein the circuit includes a fifth switch connected to a first end of the first additional resistor, and wherein the processor is configured to control turn on the fifth switch when the loop filter is set to satisfy the second-order transfer function.

9. The sigma delta modulation device of claim 8, wherein the processor is configured to control turn on or off of the plurality of switches so as to adjust resistor values to be reduced in the equivalent circuit of the loop filter for satisfying the second-order transfer function in order to increase the notch frequency of the loop filter, and to adjust resistance values of at least two resistors among the plurality of resistors in order to increase a signal to noise ratio (SNR) of the sigma delta modulation device.

10. The sigma delta modulation device of claim 9, wherein the at least two resistors include the fourth resistor, the fifth resistor, a second additional resistor having a resistance value of a first same ratio connected to the fourth resistor in series, and a third additional resistor having a resistance value of a second same ratio to the fifth resistor connected to the fourth resistor in series, wherein the circuit includes a sixth switch connected to both ends of the second additional resistor, and a seventh switch connected to both ends of the third additional resistor, and wherein the processor is configured to control turn off the sixth switch and the seventh switch when the loop filter is set to satisfy the second-order transfer function.

11. The sigma delta modulation device of claim 8, wherein the processor is configured to control turn on the first switch, the second switch, and the fourth switch and turn off the third switch so as to be represented the signal transfer characteristics of the loop filter for satisfying the third-order transfer function.

12. The sigma delta modulation device of claim 8, wherein the processor is configured to control turn off the first switch, the second switch, and the fourth switch and turn on the third switch so as to be represented signal characteristics of the loop filter for satisfying the second-order transfer function.

13. The sigma delta modulation device of claim 8, wherein the circuit further comprises a first inverting circuit and a second inverting circuit for expressing differential signals as a single end, and wherein second ends of the second resistor and the third resistor are connected to a ground, a second end of the fourth resistor is connected to an output terminal of the operational amplifier, a second end of the fifth resistor is connected to an output terminal of the second inverting circuit, a second end of the sixth resistor is connected to an output terminal of the first inverting circuit, and a second end of the seventh resistor is connected to a third node to which the input signal is applied.

14. The sigma delta modulation device of claim 8, wherein the seventh resistor is a variable resistor, and wherein the processor is configured to control a resistance value of the seventh resistor in order to adjust a change in bandwidth according to turning on or off of the plurality of switches.

* * * * *